US008633846B2

(12) United States Patent
Wu et al.

(10) Patent No.: US 8,633,846 B2
(45) Date of Patent: Jan. 21, 2014

(54) SUCCESSIVE APPROXIMATION REGISTER ANALOG TO DIGITAL CONVERTER

(75) Inventors: Qiong Wu, San Jose, CA (US); Kevin Mahooti, Sunnyvale, CA (US); Qinghai Hu, Suzhou (CN)

(73) Assignee: NXP B.V., Eindhoven (NL)

( * ) Notice: Subject to any disclaimer, the term of this patent is extended or adjusted under 35 U.S.C. 154(b) by 73 days.

(21) Appl. No.: 13/363,255

(22) Filed: Jan. 31, 2012

(65) Prior Publication Data
US 2013/0194115 A1 Aug. 1, 2013

(51) Int. Cl.
*H03M 1/38* (2006.01)
*H03M 1/68* (2006.01)

(52) U.S. Cl.
USPC ............................ 341/163; 341/156; 341/145

(58) Field of Classification Search
USPC .................. 341/118, 120, 145, 156, 161, 163
See application file for complete search history.

(56) References Cited

U.S. PATENT DOCUMENTS

| | | | | |
|---|---|---|---|---|
| 4,465,996 A | * | 8/1984 | Boyacigiller et al. | 341/118 |
| 5,252,976 A | * | 10/1993 | Miho et al. | 341/163 |
| 2007/0075884 A1 | * | 4/2007 | Melanson et al. | 341/120 |
| 2008/0001804 A1 | | 1/2008 | Draxelmayr | |
| 2010/0109924 A1 | * | 5/2010 | Cho et al. | 341/118 |
| 2011/0133971 A1 | * | 6/2011 | Ogawa et al. | 341/155 |

OTHER PUBLICATIONS

Ogawa et al., Non-Binary SAR ADC with Digital Error Correction for Low Power Applications, IEEE Asia Pacific Conference on Circuits and Systems (APCCAS), IEEE, Dec. 2010, pp. 196-199.*
Arian et al., Successive Approximation ADC with Redundancy Using Split Capacitive-Array DAC, IEEE, 2011 19th Iranian Conference on Computers and Electrical Engineering (ICEE), May 2011, pp. 1-4.*
Tomohiko Ogawa, et al.,"SAR ADC Algorithm with Redundancy and Digital Error Correction", IEICE Trans. Fundamentals, vol. E93-A, No. 2 Feb. 2010.
Tomohiko Ogawa, et al., "SAR ADC Algorithm with Redundancy", IEEE, 978-1-4244-2342-2/08, 2008.
Shintaro Shimokura, et al., "Conversion Rate Improvement of SAR ADC with Digital Error Correction", IEEJ Int. Analog VLSI Workshop, Limerick, Ireland, Nov. 2007.
Masao Hotta, et al., "SAR ADC Architecture with Digital Error Correction", IEEJ Int. Analog Workshop, Hangzhou, China, Nov. 2006.

* cited by examiner

*Primary Examiner* — Howard Williams (57) ABSTRACT

An apparatus implements analog-to-digital conversion with released requirement on the reference settling errors and improved immunity to the noise originated from the power supply, ground and the positive and negative references. It includes a comparator comparing the specified reference levels with the analog input, multi DAC sub-circuits with separate non-binary search schemes applied to and a digital control logic controlling the reference search process. No cross-talk occurs among the different non-binary search algorithms. Each redundancy scheme is localized in a respective DAC sub-circuit and covers the reference levels only in the current DAC. The non-binary search algorithms are fulfilled in the digital domain and trade the non-binary search step sizes with the number of the search steps to introduce redundancy to the reference levels.

13 Claims, 8 Drawing Sheets

| coarse DAC search step | step size P(i) | redundancy Q(i) | unit |
| --- | --- | --- | --- |
| 1 | 16 | 0 | LSBc |
| 2 | 8 | 0 | LSBc |
| 3 | 4 | 0 | LSBc |
| 4 | 2 | 0 | LSBc |
| 5 | 1 | 0 | LSBc |
| coarse DAC search step | step size P(i) | redundancy Q(i) | unit |
| 1 | 64 | 0 | LSB |
| 2 | 32 | 0 | LSB |
| 3 | 16 | 0 | LSB |
| 4 | 8 | 0 | LSB |
| 5 | 4 | 0 | LSB |
| 6 | 2 | 0 | LSB |
| 7 | 1 | 0 | LSB |

FIG. 5a

| coarse DAC search step | step size P(i) | redundancy Q(i) | unit |
|---|---|---|---|
| 1 | 16 | 1 | LSBc |
| 2 | 8 | 1 | LSBc |
| 3 | 4 | 1 | LSBc |
| 4 | 2 | 1 | LSBc |
| 5 | 1 | 0 | LSBc |
| 6 | 1 | 0 | LSBc |
| coarse DAC search step | step size P(i) | redundancy Q(i) | unit |
| 1 | 64 | 28 | LSB |
| 2 | 18 | 10 | LSB |
| 3 | 18 | 10 | LSB |
| 4 | 9 | 5 | LSB |
| 5 | 7 | 4 | LSB |
| 6 | 4 | 2 | LSB |
| 7 | 3 | 1 | LSB |
| 8 | 2 | 1 | LSB |
| 9 | 1 | 0 | LSB |
| 10 | 1 | 0 | LSB |

SUCCESSIVE APPROXIMATION REGISTER ANALOG TO DIGITAL CONVERTER

Many analog-to-digital converter (ADC) approaches are implemented using successive approximation. In successive approximation, a binary search algorithm is implemented, where an analog voltage is compared to reference voltages over a number of cycles. In each cycle, the analog voltage is compared to the reference voltage to determine a digital bit value. If the input voltage is greater than the reference voltage, a step voltage is added to the current reference voltage. The new generated voltage is used as a reference voltage input for the next cycle stage for more accurate comparison. In each successive cycle of the binary search, the search space is generally halved by adjusting the reference voltage to be centered in the remaining possible voltage range. In this manner, successive cycles are used to increase accuracy of the comparison with the same analog input to determine the next less-significant bits.

In one approach, a digital-to-analog converter (DAC) is controlled by digital logic to generate the references for a binary search of an analog voltage range. In order to achieve an N-bit resolution for an N-bit successive approximation register (SAR) ADC, each reference level fed to the comparator input has to be settled within +/−0.5LSB error, where the "1.0LSB" is defined as "$(V_{REFP}-V_{REFN})/2^N$", which is the smallest voltage that can be detected by the "N-bit" ADC. The overall settling time of the references from the DAC employed in the binary search process dominates the SAR ADC conversion speed, especially when the DAC is built up by a resistor ladder and the comparison is performed by a dynamic latch. Further, disturbances, such as the noise sinking from the power supply, the ground, and the positive and negative references, and the finite gain of the real comparator, which defines the minimum amount of input change (resolution) necessary to make the output swing between the two binary states, may affect comparator operation. For example, input of the comparator may vary at the instant when the comparator makes the decision. As a result, the comparator outputs go to the wrong polarity and further change the following binary search direction and introduce conversion errors.

Redundancy may be implemented to enhance reliability, enable correction of the comparator meta-stability error, and increase the speed and accuracy of the SAR ADC. The redundancy creates overlaps between two or more reference levels by using either more comparators or additional search steps for each analog input.

In some other embodiments, multiple comparators may be used to check a larger voltage range each cycle. For example, three comparators may be used to compare the analog input with three different reference levels, such as "¾ $V_{REF}$", "½ $V_{REF}$", and "¼ $V_{REF}$". The three comparators generate three digital outputs "C3C2C1". These three digital numbers are encoded by the encoder to create a two-bit digital output "D2D1" as either "00" or "01" or "10" or "11". The two middle codes "01" and "10" cover the current search step and the other two codes "00" and "11" overlap with the reference ranges next to it to introduce redundancy. However, the offset mismatch among these three comparators, which is equivalent to the reference level deviation, introduces potential linearity error.

As an alternative to employing more comparators, redundancy can also be created by using a non-binary search approach. Non-binary search is different from the conventional binary search algorithm, in which the SAR ADC output is expressed as, $$D_{out} = D(N-1)2^{N-1} + D(N-2)2^{N-2} - \ldots + D(1)2 + D(0) = \qquad (1)$$

$$2^{N-1} + \left(\sum_{i=2}^{N} S(i-1)2^{N-1}\right) + \frac{1}{2}(S(N)-1)$$

where "S(i)" is equal to "1", when "D(i)=1" and "S(i)" is equal to "−1", when "D(i)=0". Rather, in one generalized non-binary algorithm, the ADC output is expressed as, $$D_{out} = 2^{N-1} + \left(\sum_{i=2}^{M} S(i-1)P(i)\right) + \frac{1}{2}(S(M)-1) \qquad (2)$$

where "P(i)" is the search step size and meets the following requirements:

$$P(1) = 2^{N-1} \qquad (3)$$

$$\sum_{i=1}^{M} P(i) = 2^N - 1 + overrange \qquad (4)$$

where "M" is the total search steps, usually "M>N". By employing the non-binary search algorithm, the redundancy "Q(i)" in the "$i^{th}$" step is expressed as Equation 5:

$$Q(i) = -P(j+1) + 1 + \sum_{i=j+2}^{M} P(i) \qquad (5)$$

Typically, only one non-binary search algorithm is applied to the entire reference search process, and the MSBs may be modified during the LSBs search process. As a result, additional settling time may be introduced.

Various example embodiments are directed to SAR ADC circuits employing non-binary search algorithms The non-binary search may be performed using different DAC sub-circuits for different levels of bit significance. In one embodiment, a SAR ADC circuit is provided that includes a DAC circuit, a comparator, a multiplexor, and a control circuit. The comparator has a first input coupled to a reference voltage and a second input coupled to an output of the multiplexor. A first input of the multiplexor is coupled to an analog input of the SAR ADC, and a second input coupled to a reference produced by the DAC circuit. The DAC circuit includes a first DAC sub-circuit, a second DAC sub-circuit, and a switch array coupling the first DAC sub-circuit to the second DAC sub-circuit. The DAC circuit is configured to output the reference voltage to the second input of the multiplexor. A control circuit is coupled to the DAC circuit and is configured to control the comparator, multiplexor, and DAC circuit to perform successive approximation on the analog input over a number of cycles by performing a first non-binary reference search using the first DAC sub-circuit and performing a second non-binary reference search using the second DAC sub-circuit.

In some embodiments, the first and second inputs of the comparator are respectively coupled to reference voltage and the multiplexor by way of respective capacitors. For instance, a bottom place of a capacitor may be coupled to the output of the multiplexor and a top plate of the capacitor may be coupled to the second input of the comparator.

In another embodiment, a method for digital-to-analog conversion is provided. The method includes two sequential non-binary reference search processes. Using a first DAC sub-circuit, a first reference search process is performed on a first set of bits of an input value. After performing the DAC on a first set of bits using the first DAC sub-circuit, a second DAC sub-circuit is used to perform a second reference search process on a second set of bits of the input value. The second set of bits is less significant than the first set of bits.

In some embodiments, the first reference search process includes performing a first non-binary search that introduces redundancy to reference levels in a first DAC sub-circuit. The first non-binary search is localized in the first DAC sub-circuit. The second reference search process includes performing a second non-binary search that introduces redundancy to reference levels in a second DAC sub-circuit. The second non-binary search is localized in the second DAC sub-circuit. During the first reference search process, reference levels of the second DAC sub-circuit are not reached. During the second reference search process, the reference levels in the first DAC sub-circuit are not reached.

In some embodiments, a control circuit is configured and arranged to correct error occurring in the first and second non-binary reference searches due to a reference settling error, a comparator meta-stability effect, and noise from the references of the DAC sub-circuits.

It will be appreciated that various other embodiments are set forth in the Detailed Description and Claims, which follow.

Various example embodiments may be more completely understood in consideration of the following detailed description in connection with the accompanying drawings, in which:

FIG. 5(*a*) is a table showing an example of search step sizes and redundancy employed in the conventional binary search;

FIG. 5(*b*) is a table showing an example of search step sizes and redundancy employed in the non-binary search scheme applied to the coarse DAC and the other non-binary search scheme applied to the fine DAC;

FIG. 6(*a*) is a block diagram showing an example of a binary search process without and with errors; and FIG. 6(*b*) is a block diagram showing an example of a non-binary search process without and with errors.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

One or more embodiments provide a SAR ADC circuit that employs a non-binary search algorithm, which may be implemented in the digital domain. The non-binary search algorithm may help to release resistive DAC output settling error requirement, improve the immunity to the reference and the power supply noise, and correct the meta-stability issue of the comparator digitally.

In one embodiment, an N-bit SAR ADC includes a comparator, a binary-weighted resistive DAC, and a digital control circuit configured to implement non-binary search algorithms. The binary-weighted resistive DAC is divided into multiple segments. For example, the binary-weighted resistive DAC may include a K-bit coarse resistive DAC (RDAC) and a (N−K)-bit fine RDAC, which are discussed in more detail with reference to FIG. 2. The coarse RDAC provides the reference levels to determine the "K" most-significant bits (MSBs) and the fine RDAC provides the reference levels to determine the "L=N−K" least-significant bits (LSBs). In one embodiment, the coarse RDAC circuit includes $2^K-1$ unit resistors and a decoder circuit configured to convert binary symbols to one-hot code, where at most one bit can be high at a time and each bit represents a symbol. The fine RDAC includes $2^L-1$ unit resistors and a decoder circuit configured to convert binary symbols to one-hot code. Output of the binary-weighted resistive DACs may be selected by a multiplexor. For example, in one implementation, one output of the $2^K-1$ unit resistors network is connected to a first input of the multiplexor and one output of the $2^L-1$ unit resistors network is connected to a second input of the multiplexor.

Figure 2:
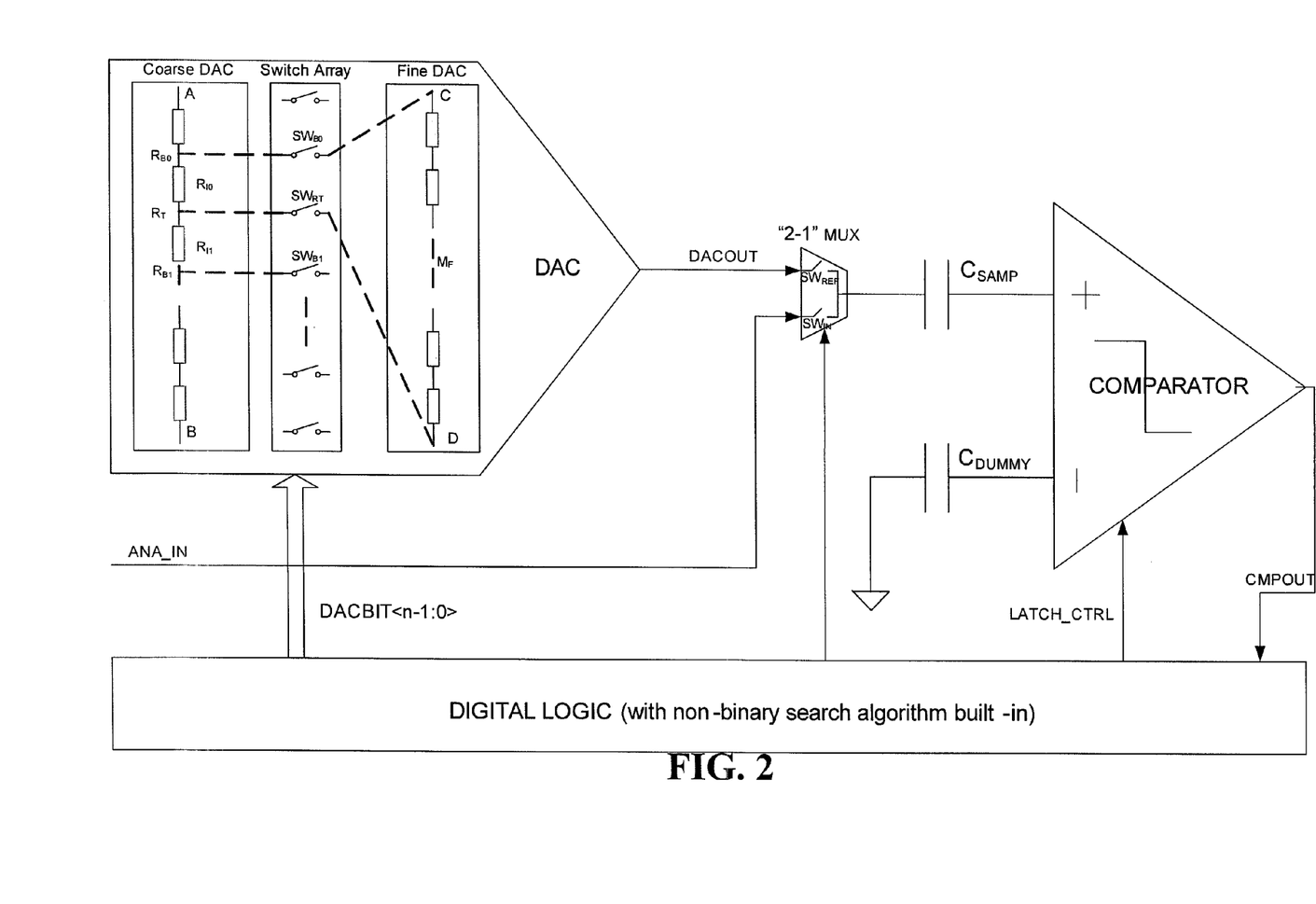
FIG. 2 is a block diagram of a SAR ADC employing separate non-binary search algorithms to different sub DACs.

The non-binary search starts with the MSB and goes step by step to the LSB. During the MSBs searching process, the fine RDAC is disconnected from the coarse RDAC. The two terminals of the fine RDAC are connected to the positive and negative references separately. The fine RDAC is connected to the coarse RDAC only when the "N−K" LSBs need to be determined. The nodes where the fine RDAC terminals are connected are decided by the last reference level applied to the last search step in the coarse RDAC.

The settling time of the reference level applied to the first search step in the fine RDAC dominates the SAR ADC conversion time. This is because the voltages at both terminals of the fine RDAC may be changed after they are connected in the coarse RDAC and there may be current sourcing from or drinking into both the coarse and the fine RDACs. As a result, voltage spikes may be generated on the first searched reference level of the fine RDAC. The discharging or charging path for the spike voltage may include, e.g. the unit resistors in the coarse RDAC as well as the unit resistors in the fine RDAC, and the parasitic capacitors introduced by the switches in the switch array and the physical connections. Meanwhile, compared with the unit resistance in the coarse RDAC, the unit resistance in the fine RDAC is much larger to reduce the nonlinearity effect. The reference level applied to the first step in the fine RDAC is at the half point in the fine resistor ladder.

One of more embodiments increase redundancy for the worse settling time case, and reduce SAR ADC processing time, while maintaining linear performance. Two different non-binary search algorithms are applied to the coarse RDAC and the fine RDAC separately. The non-binary search scheme provided to the coarse RDAC creates redundancy to the reference levels in the coarse RDAC only. The other non-binary search scheme provided to the fine RDAC creates redundancy to the reference levels in the fine RDAC only. The higher bits determined by the reference levels in the coarse RDAC may be modified in the process of determining lower bits using reference levels in the coarse RDAC. The higher bits determined by the reference levels in the fine RDAC may be modified during the determination of lower bits in the fine RDAC. There is no cross-correction happened between the two DAC segments.

In some embodiments, only one comparator is included in the SAR DAC circuit. This eliminates offset mismatch between comparators, which otherwise would contribute additional nonlinearity errors. In addition, power requirements and die size may be reduced. In some embodiments, the DACs are implemented so the resistive ladders in the DACs consist of only unit resistors with same dimension and same value. The matching of the resistor network can reach as optimal as 10-bit resolution. Because there is no mismatch due to the different value/dimension, degradation of linearity performance may be reduced.

Figure 1:
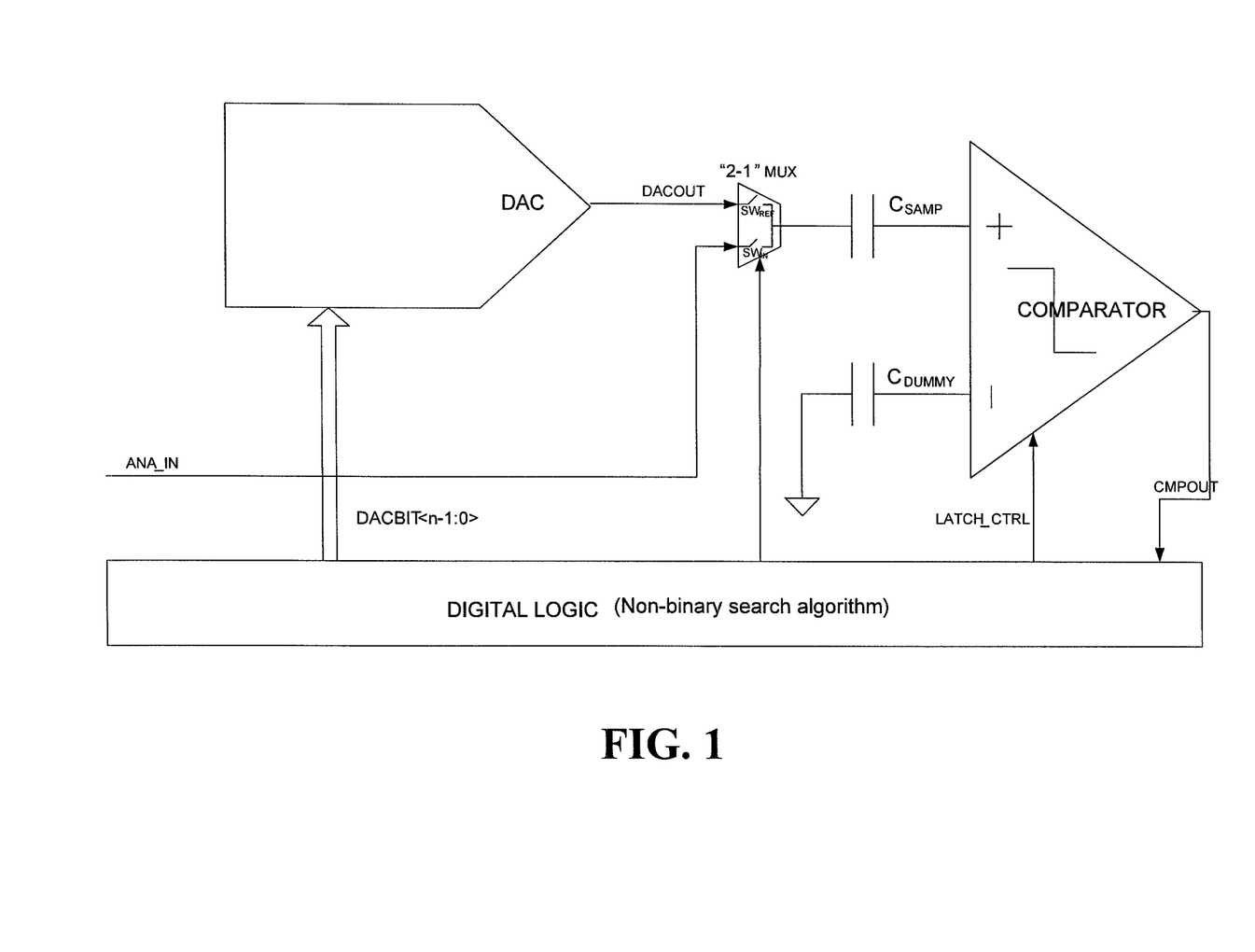
FIG. 1 is a block diagram of a SAR ADC structure, configured in accordance with one or more embodiments.

FIG. 1 shows a block diagram of a SAR ADC configured to implement a non-binary search scheme in accordance with one or more embodiments. The SAR ADC includes a comparator, a DAC, and a control circuit configured to implement two independent non-binary search algorithms. The control circuit configures the DAC to execute two independent non-binary search algorithms For example, the two non-binary search algorithms may split reference searching to be performed between two DAC sub-circuits. For instance, a first sub-DAC may operate on a significant set of most-significant-bits (MSB) according to one of the non-binary search algorithms. A second sub-DAC may operate on the remaining least significant bits (LSB) according to the second non-binary search algorithms.

Various embodiments may implement various components (e.g., DAC, control logic, etc.) using a number of different circuits. While not so limited, for each of explanation, embodiments and examples are primarily described with reference to a SAR ADC having an ADC that includes multiple sub-DACs as shown and discussed with reference to FIG. 2.

FIG. 2 shows an N-bit SAR ADC configured to implement a non-binary search scheme in accordance with one or more embodiments. The SAR ADC includes a comparator, a sub DAC, and a control circuit configured to implement two independent non-binary search algorithms. The sub-DAC includes a K-bit coarse RDAC, a L-bit fine RDAC, and a switch array in between. The two terminals of the coarse RDAC are connected to the positive and the negative references respectively. The two terminals of the fine RDAC are connected to the positive and the negative references during the reference search process in the coarse RDAC and connected to two terminals of one of the unit resistors in the coarse RDAC via two switches in the switch array during the reference search process in the fine RDAC. The comparator compares the analog input ("ANA_IN") with the reference level provided by the DAC for each search step and the output of the comparator is fed to the digital logic. Based on the polarity of the comparator output, the successive approximation registers under the control of the two binary search algorithms generate the "N" bit digital input to the DAC to send the reference level for the next search step out.

Figure 3:
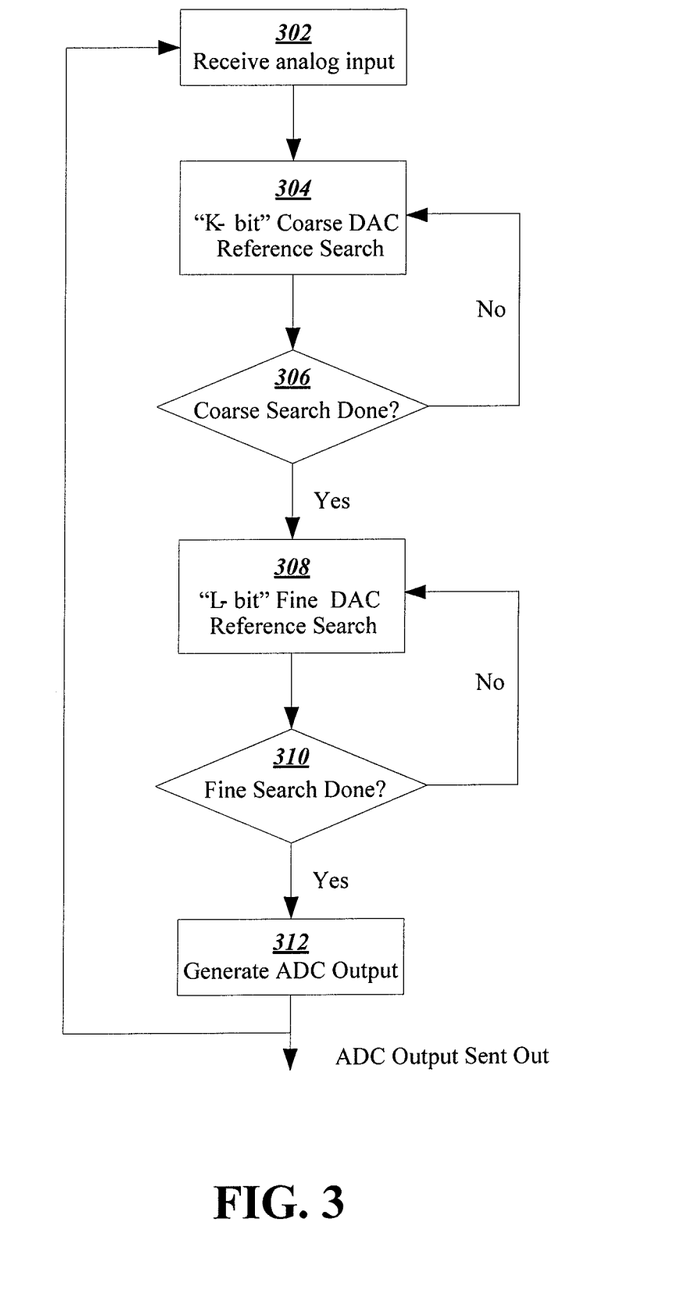
FIG. 3 shows a flowchart of a non-binary search ADC process performed in accordance with one or more embodiments.

FIG. 3 shows a flowchart of a non-binary search ADC process performed in accordance with one or more embodiments. An N-bit analog-to-digital conversion starts with the analog input sampling at block 302 followed by two different non-binary search schemes in sequence. A coarse K-bit DAC search is performed at block 304 for the "K" most significant bits. When the coarse search has completed at decision block 306, fine L-bit DAC search is performed at block 308 for the "L" least significant bits ("N=K+L"). When the fine search has completed at decision block 310, the digital value is output at block 312.

Figure 4:
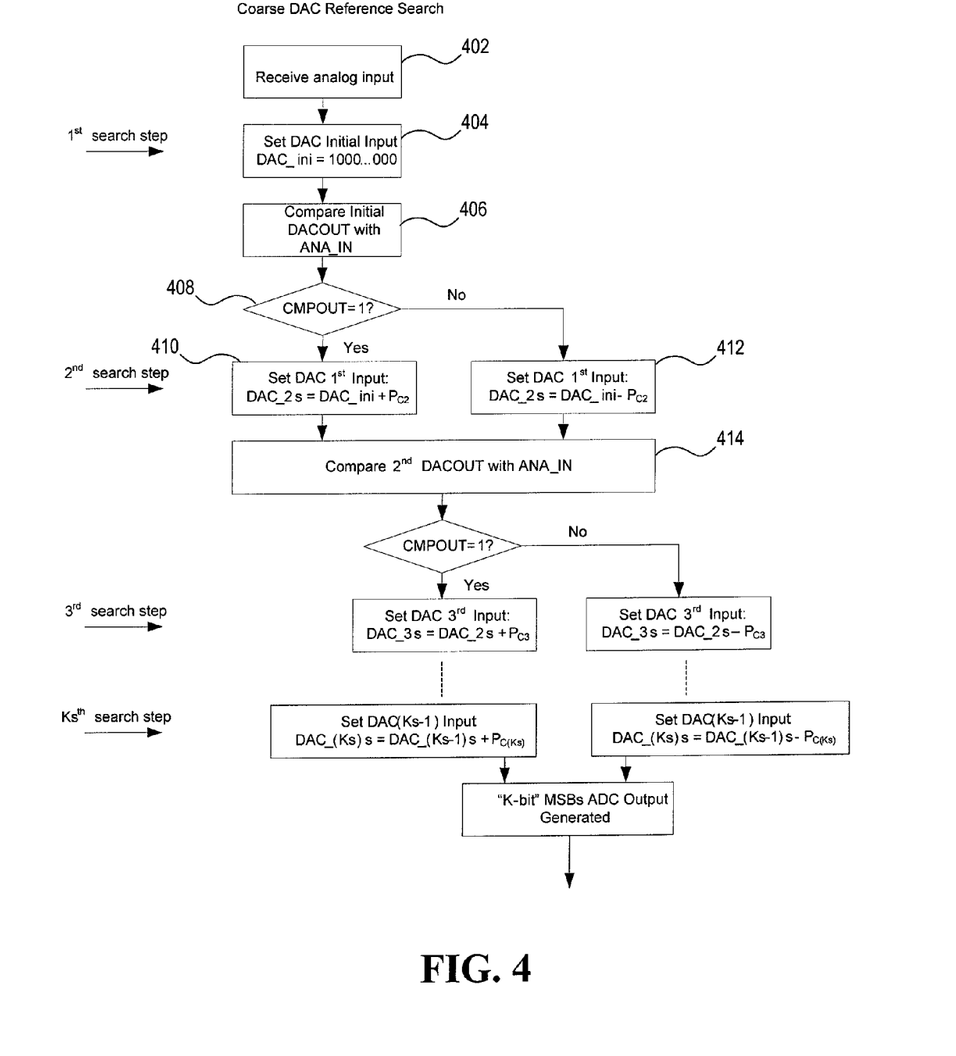
FIG. 4 shows a flowchart of a search process that may be used to implement the coarse search performed at block 304 in one or more embodiments.

FIG. 4 shows a flowchart of a search process that may be used to implement the coarse search performed at block 304 of FIG. 3 using the SAR ADC shown in FIG. 2. Analog input ("ANA_IN") is received at block 402. In a first step, the DAC is set to an initial input value ("DAC_ini") at block 404. The output of the DAC ("DACOUT") is compared to "ANA_IN" at block 406. If "CMPOUT" is "1" at decision block 408, the DAC is set to a sum of "DAC_ini" and a step "$P_{C2}$" at block 410. Otherwise, the DAC is set to a value of "DAC_ini" less the step $P_{C2}$ at block 412. In each subsequent search step "Kj" (1<j<s), if the "CMPOUT" from previous step is "1", a step "$P_{C(j)}$" is added to the previous DAC value. Otherwise, "$P_{C(j)}$" is subtracted from the previous DAC value. The updated DACOUT is compared with "ANA_IN" (e.g., 414) to generate a new "CMPOUT". For the "K" bit coarse RDAC, "$K_S$" search steps are needed ("$K_S$">"K"). The "$K_S$-K" more steps repeat some "K" binary search steps with the same step sizes to implement redundancy. The redundancy achieved by the "$K_S$-K" more steps for the $j^{th}$ search step is given as $$Q_C(j) = -P_C(j+1) + 1 + \sum_{i=j+2}^{K_S} P_C(i) \qquad (6)$$

where "$Q_C(j)$" is the redundancy provided to the $j^{th}$ search step, and "$P_C(j+1)$" is the step size applied to the $(j+1)^{th}$ search step. "$P_C(j+1)$" meets the following requirements:

$$P_C(1) = 2^{K-1} \qquad (7)$$

$$\sum_{i=1}^{K_S} P_C(i) = 2^K - 1 + (overrange) \qquad (8)$$

where "$P_C(1)$" is the step size applied to the first search step in the coarse RDAC and the "overrange" is defined as the number of "LSBs" that is out of the $(2^N-1)$ range.

The L-bit fine RDAC may be performed in a similar manner to the coarse search process shown in FIG. 4. For the "L" bit fine RDAC, "$L_S$" search steps are needed and "$L_S$" is larger than "L". The "$L_S$-L" additional search steps used in the non-binary search process creates redundancy to some of the reference levels. The search step size in the "L" bit fine RDAC meets the following requirements:

$$P_F(1) = 2^{L-1} \qquad (9)$$

$$\sum_{i=1}^{L_S} P_F(i) = 2^L - 1 \qquad (10)$$

where "$P_F(1)$" is the step size applied to the first search step in the fine RDAC. The redundancy introduced to each reference level due to the "$L_S$-L" search steps in the fine RDAC is expressed as:

$$Q_F(j) = -P_F(j+1) + 1 + \sum_{i=j+2}^{L_S} P_F(i) \qquad (11)$$

where "$Q_F(j)$" is the redundancy range for the $j^{th}$ search step, and "$P_F(j+1)$" is the step size applied to the $(j+1)^{th}$ search step.

Referring again to FIG. 2, once the analog-to-digital conversion starts, the analog input "ANA_IN" is sampled on the bottom plate of the sampling capacitor called "$C_{SAMP}$", the top plate of which is connected to the positive input of the comparator when the sampling switch "$SW_{IN}$" in the "2-1" multiplexor is turned on and held there when the switch "$SW_{IN}$" is turned off until the other switch "$SW_{REF}$" in the "2-1" multiplexor controlling the reference path (DAC output) is turned on. MSBs search process is performed using the coarse RDAC. During the MSBs search process, both terminals ("A" and "B") of the resistor array in the coarse RDAC, and both terminals ("C" and "D") of the other resistor array in the fine RDAC, are respectively connected to the positive reference "$V_{REFP}$" and the negative reference "$V_{REFN}$". All of the switches in the switch array are turned off. The first reference level provided by the first search step is the middle point of the coarse resistor ladder, the voltage of which is equal to "$(V_{REFP}-V_{REFN})/2$". The sampling capacitor "$C_{SAMP}$" is charged from "$V_{IN}$" to "$(V_{REFP}-V_{REFN})/2$". The voltage variation "$\Delta V1$", equal to "$(V_{REFP}-V_{REFN})/2-V_{IN}$", is coupled to the positive input of the comparator. The comparator compares "$\Delta V1$" with the reference voltage (e.g., a virtual ground) at the negative input of the comparator. If the output of the comparator goes to "0", the second reference provided by the second search step in the coarse DAC is "$(V_{REFP}-V_{REFN})/4$" higher than "$(V_{REFP}-V_{REFN})/2$". "$(V_{REFP}-V_{REFN})/4$" is the second search step size "$P(2)$" proposed in the non-binary search algorithm employed in the coarse RDAC. If the output of the comparator goes to "1", the second reference provided by the second search step in the coarse RDAC is "$(V_{REFP}-V_{REFN})/4$" lower than "$(V_{REFP}-V_{REFN})/2$". The second reference voltage is then charged to the bottom plate of the sampling capacitor "$C_{SAMP}$", which changes the voltage there to either "$3(V_{REFP}-V_{REFN})/4$" or "$(V_{REFP}-V_{REFN})/4$". The voltage variation "$\Delta V2$" equal to either "$3(V_{REFP}-V_{REFN})/4-V_{IN}$" or "$(V_{REFP}-V_{REFN})/4-V_{IN}$" is coupled to the positive input of the comparator to determine the second comparator output polarity. This search process continues until the "$(K+1)^{th}$" step. The "$(K+1)^{th}$" step and the search step that follows duplicate the "$K^{th}$" search step.

Figure 5A:
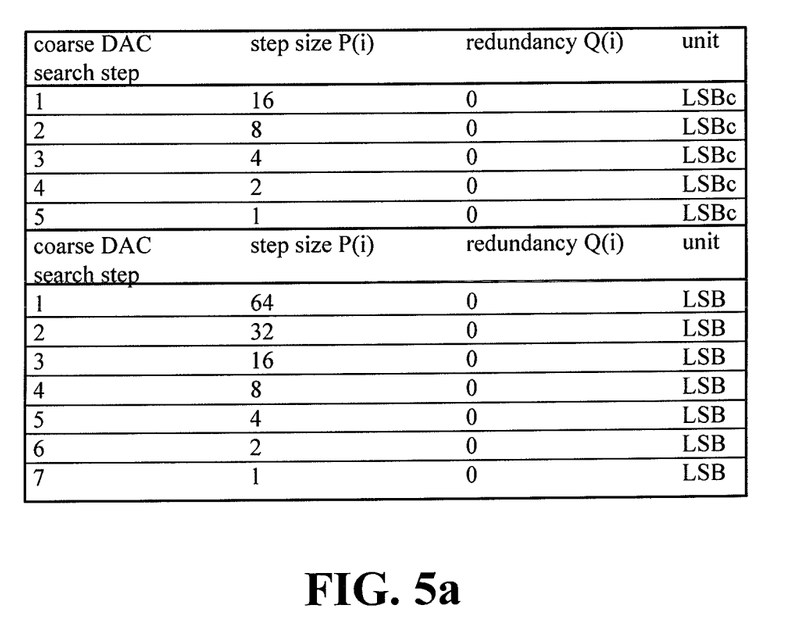
Figure 5B:
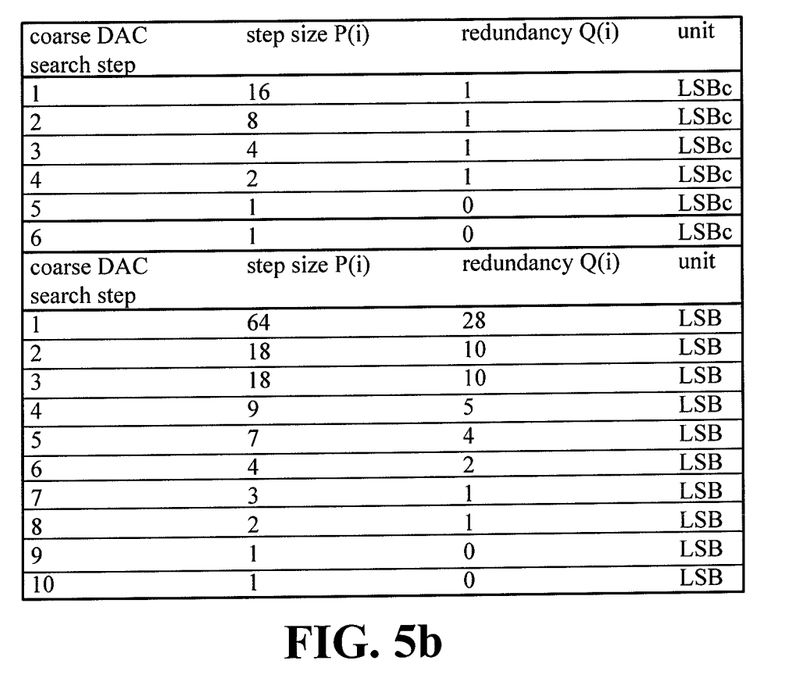

FIG. 5(a) shows a table of search step sizes and redundancy employed in the conventional binary search. FIG. 5(b) shows a table of search step sizes and redundancy employed in the non-binary search scheme applied to the coarse DAC and the other non-binary search scheme applied to the fine DAC. FIG. 5(b) shows an example of the non-binary search scheme for a "5-bit" coarse RDAC in a "12-bit" SAR ADC. Compared with the conventional binary search algorithm shown in FIG. 5(a), the non-binary search scheme shown in FIG. 5(b) repeats the last step, step 5, given in FIGS. 5(a)(b) one more time and introduces the step 6 shown in FIG. 5(b). This changes the reference search pattern from "$16LSB_C \to 8LSB_C \to 4LSB_C \to 2LSB_C \to 1LSB_C$" (shown as FIG. 5(a)) to "$16LSB_C \to 8LSB_C \to 4LSB_C \to 2LSB_C \to 1LSB_C \to 1LSB_C$" (shown as FIG. 5(b)), where the "$LSB_C=(V_{REFP}-V_{REFN})/2^K$" is defined as the one-bit resolution of the coarse DAC. Since the two terminals ("C" and "D") of the fine RDAC are connected to the two terminals of one unit resistor in the coarse RDAC during the reference search process in the fine RDAC, the one "$LSB_C$" in the coarse DAC covers the entire reference range of the resistor ladder in the fine RDAC. For a 12-bit SAR ADC, the one "$LSB_C$" is equivalent to "$2^{(12-5)}$ LSBs=128LSBs", where "$LSB=(V_{REFP}-V_{REFN})/2^{12}$" is the minimum voltage that can be distinguished by a 12-bit ADC. Therefore, if represented with the unit "LSB", the search step sizes "$P_C(1)$", "$P_C(2)$", "$P_C(3)$", "$P_C(4)$", and "$P_C(5)$" in the coarse RDAC search process are "2048LSBs", "1024LSBs", "512LSBs", "256LSBs" and "128LSBs". The $6^{th}$ search step size "$P_C(6)$" is same as that of the $5^{th}$. It is "128LSBs". The $6^{th}$ search step introduces redundancy to some of the previous searched references. According to Equation 6, the redundancy for the reference reached by the $1^{st}$ search step is $$Q_C(1)=-P_C(1+1)+1+(P_C(1+2)+P_C(1+3)+P_C(1+4)+P_C(1+5))=-8LSB_C+1LSB_C+(4LSB_C+2LSB_C+1LSB_C+1LSB_C)=1LSB_C=128LSBs.$$

The redundancy for the reference reached by the $2^{nd}$ searched step is $$Q_C(2)=-P_C(2+1)+1+(P_C(2+2)+P_C(2+3)+P_C(2+4))=-4LSB_C+1LSB_C+(2LSB_C+1LSB_C+1LSB_C)=1LSB_C=128LSBs.$$

The redundancy for the reference reached by the $3^{rd}$ searched step is $$Q_C(3)=-P_C(3+1)+1+(P_C(3+2)+P_C(3+3))=-2LSB_C+1LSB_C+(1LSB_C+1LSB_C)=1LSB_C=128LSBs.$$

The redundancy for the reference reached by the $4^{th}$ searched step is $$Q_C(4)=-P_C(4+1)+1+P_C(4+2)=-LSB_C+1LSB_C+1LSB_C=1LSB_C=128LSBs.$$

No redundancy is provided by the $5^{th}$ and the $6^{th}$ search steps. The "overrange" value of the non-binary search scheme shown in FIG. 5(b) is "$1LSB_C=128LSBs$", since "$(16LSB_C+8LSB_C+4LSB_C+2LSB_C+1LSB_C+1LSB_C)-(2^5-1)LSB_C=1LSB_C$".

Once the last search step in the coarse RDAC is over, the final reference level provided by the coarse RDAC has been decided. For example, it is the reference from the node "$R_T$" in the coarse resistive ladder shown in FIG. 2. If the comparator output corresponding to the last reference level is "0", the two terminals ("C" and "D") of the resistor ladder in the fine RDAC are connected to node "$R_{B0}$" and node "$R_T$" via two switches "$SW_{B0}$" and "$SW_{RT}$" in the switch array, respectively. The node "$R_{B0}$" is higher than "$R_T$" and is connected to one terminal of the unit resistor "$R_{f0}$", whose other terminal is connected to node "$R_T$". If the comparator output corresponding to the last reference level is "1", the two terminals ("C" and "D") of the resistor ladder in the fine RDAC are connected to node "$R_T$" and node "$R_{B1}$" by respective switches "$SW_{RT}$" and "$SW_{B1}$" in the switch array. The node "$R_{B1}$" is lower than "$R_T$" and is connected to one terminal of the unit resistor "$R_{f1}$", whose other terminal is connected to node "$R_T$". The fine resistor ladder sub-divides the voltage drop between the "$R_T$" and "$R_{B0}$"/"$R_{B1}$", which is "$1LSB_C$" and provides the reference levels to determine the LSBs.

For example, during the reference search process in the fine RDAC, the switches "$SW_{B0}$" and "$SW_{RT}$" may be turned on to connect two terminals—"C" and "D" of the resistor ladder in the fine RDAC to node "$R_{B0}$" and node "$R_T$". The first reference level provided by the first search step in the fine RDAC is the reference at the middle point "$M_F$" of the fine resistor ladder. The voltage at "$M_F$" equal to "$(V_{B0}-V_{RT})/2=(V_{REFP}-V_{REFN})/2^{K+1}$" is charged to the bottom plate of the sample comparator "$C_{SAMP}$" changing the voltage there to "$(V_{B0}-V_{RT})/2$". The voltage variation "$(V_{B0}-V_{RT})/2-V_{IN}$" is coupled to the positive input of the comparator. Similar to the coarse reference search process, the comparator compares "$(V_{B0}-V_{RT})/2-V_{IN}$" with the virtual ground to determine the polarity of the first output. If the first output of the comparator for the first search step is "1", the first reference voltage provided by the first reference search is "$(V_{B0}-V_{RT})/2>V_{IN}$", and the second reference level provided by the second search step is equal to "$(V_{B0}-V_{RT})/2-P_F(2)$". "$P_F(2)$" is the second search step size. If the first output of the comparator for the first search step is "0", the first reference voltage is equal to "$(V_{B0}-V_{RT})/2<V_{IN}$" and the second reference is equal to "$(V_{B0}-V_{RT})/2=P_F(2)$".

Each of the following reference levels provided by each of the following search steps follows the same criteria as being used to determine the second reference level in the second search step. For example, the $j^{th}$ reference level provided by the $j^{th}$ search step is equal to either "$V(j-1)+P(j)$", when the $(j-1)^{th}$ output of the comparator is "0" or "$V(j-1)-P(j)$", when the $(j-1)^{th}$ output of the comparator is "1", where the "$V(j-1)$" is the reference voltage provided by the $(j-1)^{th}$ search step. This search process continues until the "$L_S^{th}$" step with the step size "$P_F(L_S)$" is complete. The voltage difference between the last reference level provided by the "$L_S^{th}$" search step and the analog input "$Y_{IN}$" is within "11LSB".

FIG. 5(b) shows an example of a non-binary search scheme used in the fine RDAC. It is based on a 12-bit resolution ADC with 5-bit coarse RDAC and 7-bit fine RDAC. The first step size provided by the first search step is "$(V_{REFP}-V_{REFN})/2^{K+1}=1LSB_C/2=64LSBs$" meeting the requirement of Equation 9, where "L=7" and "P(1)=64LSBs". The second search step size is "$P_F(2)=18LSBs$" instead of "32LSBs" as used in the conventional binary search process shown in FIG. 5(a). Similarly, for the $3^{rd}$, $4^{th}$ ... $7^{th}$ search steps, the respective search step sizes "18LSBs", "9LSBs", "7LSBs", "4LSBs" and "3LSBs" are provided as shown in FIG. 5(b), rather than "16LSBs", "8LSBs", "4LSBs", "2LSBs" and "1LSBs" shown in FIG. 5(a). The additional search steps—step $8^{th}$, $9^{th}$ and $10^{th}$ are introduced in the non-binary search scheme employed by the fine RDAC shown in this example. The step sizes "2LSBs", "1LSBs" and "1LSBs" are provided to these three steps. The overall search step sizes used in the non-binary search scheme is equal to "64LSBs+18LSBs+18LSBs+9LSBs+7LSBs+4LSBs+3LSBs+2LSBs+1LSBs+LSBs=127LSBs" meeting the requirement of Equation 10, where "L=7" and "$2^L-1=127LSBs$". No "overrange" factor is involved. Based on the previous search step sizes and the comparator output for each previous search step, the fine RDAC provides the reference level for the current search step under the control of the non-binary search algorithm built in the digital logic block. For example, in the second search step, the second reference voltage provided by the fine RDAC is either equal to "64LSBs−18LSBs=46LSBs" (when comparator output for the first search step is "1") or "64LSBs+18LSBs=82LSBs" (when comparator output for the first search step is "0"). The introduction of the three more search steps in the non-binary search process provides redundancy to the first eight search steps. According to Equation 11, the redundancy for the reference reached by the $1^{st}$ search step is $Q_F(1)=-P_F(1+1)+1+(P_F(1+2)+P_F(1+3)+P_F(1+4)+P_F(1+5)+P_F(1+6)+P_F(1+7)+P_F(1+8)+P_F(1+9))=-18LSBs+1LSB+(18LSBs+9LSBs+7LSBs+4LSBs+3LSBs+2LSBs+1LSB+1LSB)=28LSBs.$ The redundancy for the reference reached by the $2^{nd}$ search step is $Q_F(2)=-P_F(2+1)+1+(P_F(2+2)+P_F(2+3)+P_F(2+4)+P_F(2+5)+P_F(2+6)+P_F(2+7)+P_F(2+8))=-18LSBs+1LSB+(9LSBs+7LSBs+4LSBs+3LSBs+2LSBs+1LSB+1LSB)=10LSBs.$ The redundancy for the reference reached by the $3^{rd}$ search step is $Q_F(3)=-P_F(3+1)+1+(P_F(3+2)+P_F(3+3)+P_F(3+4)+P_F(3+5)+P_F(3+6)+P_F(3+7))=-9LSBs+1LSB+(7LSBs+4LSBs+3LSBs+2LSBs+1LSB+1LSB)=10LSBs.$ The redundancy for the reference reached by the $4^{th}$ search step is $Q_F(4)=-P_F(4+1)+1+(P_F(4+2)+P_F(4+3)+P_F(4+4)+P_F(4+5)+P_F(4+6))=-7LSBs+1LSB+(4LSBs+3LSBs+2LSBs+1LSB+1LSB)=5LSBs.$ The redundancy for the reference reached by the $5^{th}$ search step is $Q_F(5)=-P_F(5+1)+1+(P_F(5+2)+P_F(5+3)+P_F(5+4)+P_F(5+5))=-4LSBs+1LSB+(3LSBs+2LSBs+1LSB+1LSB)=4LSBs.$ The redundancy for the reference reached by the $6^{th}$ search step is $Q_F(6)=-P_F(6+1)+1+(P_F(6+2)+P_F(6+3)+P_F(6+4))=-3LSBs+1LSB+(2LSBs+1LSB+1LSB)=2LSBs.$ The redundancy for the reference reached by the $7^{th}$ search step is $Q_F(7)=-P_F(7+1)+1+(P_F(7+2)+P_F(7+3))=-2LSBs+1LSB+(1LSB+1LSB)=1LSB";$ The redundancy for the reference reached by the $8^{th}$ search step is $Q_F(8)=-P_F(8+1)+1+P_F(8+2)=-1LSBs+1LSB+1LSB=1LSB.$ There is no redundancy for the last two search steps.

The final "N-bit" digital output of the SAR ADC for each analog input is determined by an "N-bit" adder and may be expressed as $$D_{out} = 2^{N-1} + \left(\sum_{i=2}^{M_S} S(i-1)P(i)\right) + \frac{1}{2}(S(M)-1) \qquad (12)$$

where "P(i)" is the search step size for the $i^{th}$ search step; "S(i)" is equal to "1", when "D(i)=1", and "S(i)" is equal to "−1", when "D(i)=0". The "D(i)" is defined by the comparator output for the $i^{th}$ search step. If the comparator output for the $i^{th}$ search step is "1", ($V_{REF}(i)>V_{IN}$), "D(i)" is equal to "0". If the comparator output for the $i^{th}$ search step is "0", ($V_{REF}(i)<V_{IN}$), "D(i)" is equal to "1". "$M_S$" is the total search steps employed for both the coarse and the fine reference search processes. It is equal to "$K_S+L_S$". The "N-bit" adder works in parallel with the reference search process. Its initial "N-bit" output "$D_{ini}<n-1:0>$" is set to "$2^{N-1}$", which is the middle point of the full digital range consistent with the first reference level in the first search step of the coarse RDAC (e.g., half of the reference range "$V_{REFP}-V_{REFN}$"). For each search step, the adder either adds the digital code "$B_i$" representing the voltage "P(i)" with "LSB" as unit to or subtracts "$B_i$" from the current "N-bit" output "$D_{step(i-1)}<n-1:0>$". For example, there is a 12-bit ADC employing the non-binary search schemes shown in FIG. 5(b). The initial "12-bit" output of the SAR ADC is the digital code "$B_0$=2048", which represents the first search step size "P(1)=16LSB$_C$=2048LSBs". If the comparator output of the first step is "1", the "12-bit" output "$D_{step(1)}<n-1:0>$" of the SAR ADC is achieved by adding code "$B_1$=1024", which represents the second search step size "P(2)=8LSB$_C$=1024LSBs" and goes to "3072". If the comparator output of the first step is "0", the "12-bit" output "$D_{step(1)}<n-1:0>$" of the SAR ADC is achieved by subtracting code "$B_1$" and goes to "1024". In the conventional binary search SAR ADC, there are "N−1" "N-bit" digital codes in total, corresponding from the last "N−1" search steps, added to/subtracted from the initial output "$D_{ini}<n-1:0>$" synchronized with the binary search process.

While in the non-binary search SAR ADC, there are "$M_S-1$" "N-bit" digital codes in total added to/subtracted from the initial output "$D_{ini}<n-1:0>$" synchronized with the non-binary search processes. Usually, "$M_S-1$ is selected to be greater than N-1" to introduce redundancy between reference levels.

The purpose of separating the redundancy scheme of the coarse DAC from the redundancy scheme of the fine DAC is to optimize the time slot division for each search step based on each reference settling pattern to ultimately reduce ADC processing time. The DAC structure shows that the reference coming from the middle point of the fine DAC reference ladder and determined by the first search step in the fine DAC search process needs the longest settling time. This is because the settling time is dominated by the time constant contributed by the "RC" network constructed by the unit resistors in both coarse and fine DAC. Settling time may also be affected by the parasitic capacitors introduced by the physical routing and the gate-to-source and gate-to-drain overlap capacitors "$C_{gs}$" and "$C_{gd}$" of the transistors in the switch array that connects the reference ladder in the fine DAC to the specified unit resistor in the coarse DAC. Each time the location of the connected-in nodes (e.g., nodes "$R_T$" and "$R_{B0}$" shown in FIG. 2) are changed, the parasitic capacitors "$C_{gs}$" and "$C_{gd}$" in the switch array have to be charged to the target voltage levels. This may be performed by sourcing or draining current from the coarse reference ladder and the reference network in both the coarse and the fine DAC has to take "$T_{settling\_max}$" to resettle to the redundancy range. Therefore, fixing the connected-in nodes "$R_T$" and "$R_{B0}$" and avoiding the reference levels in the coarse DAC being revisited in the fine DAC reference search process are critical to optimize the speed. The coarse DAC and the fine DAC are treated as two separate reference structures. Two different non-binary search schemes are applied to each of them, respectively, which isolates the non-binary search process in the coarse DAC from the other non-binary search process in the fine DAC. The MSBs determined by the early search steps in the reference search process of the coarse DAC can only be modified by the following search steps in the coarse reference search process. The LSBs determined by the early search steps in the reference search process of the fine DAC can only be modified by the following search steps in the fine DAC. The SAR bits determined by the coarse DAC are fixed during the fine DAC reference search process, as well as the connected-in nodes.

Meanwhile, based on the generic Equation 4 and Equation 5 for the non-binary search algorithm, the redundancy range for the "$j^{th}$" reference level provided in the "$j^{th}$" search step can be expressed as $$Q(j) = (2^N + overrange) - \left(P(j+1) + \sum_{i=1}^{j+1} P(i)\right) \quad (13)$$

where the maximum Q(j) is achieved when the sum of $$P(j+1) + \sum_{i=1}^{j+1} P(i) \quad (14)$$

goes to a minimum. This happens when "j" is equal to 1 because the search step size "P(i)" is always a positive integer, and $$Q(1) = 2^N + overrange - (P(1) + 2P(2)) \quad (15)$$

is the maximum redundancy applied to the first reference level in any non-binary reference search process. Therefore, initiating the second non-binary search process for the fine DAC, instead of following the non-binary search scheme employed in the coarse DAC, provides the maximum redundancy to the reference level sent out by the first search step in the fine DAC. This increases tolerance to settling errors and thus reduces the maximum settling time needed in the conversion process. In this manner, the processing speed of the SAR ADC proposed in FIG. 2 may be improved.

Figure 6A:
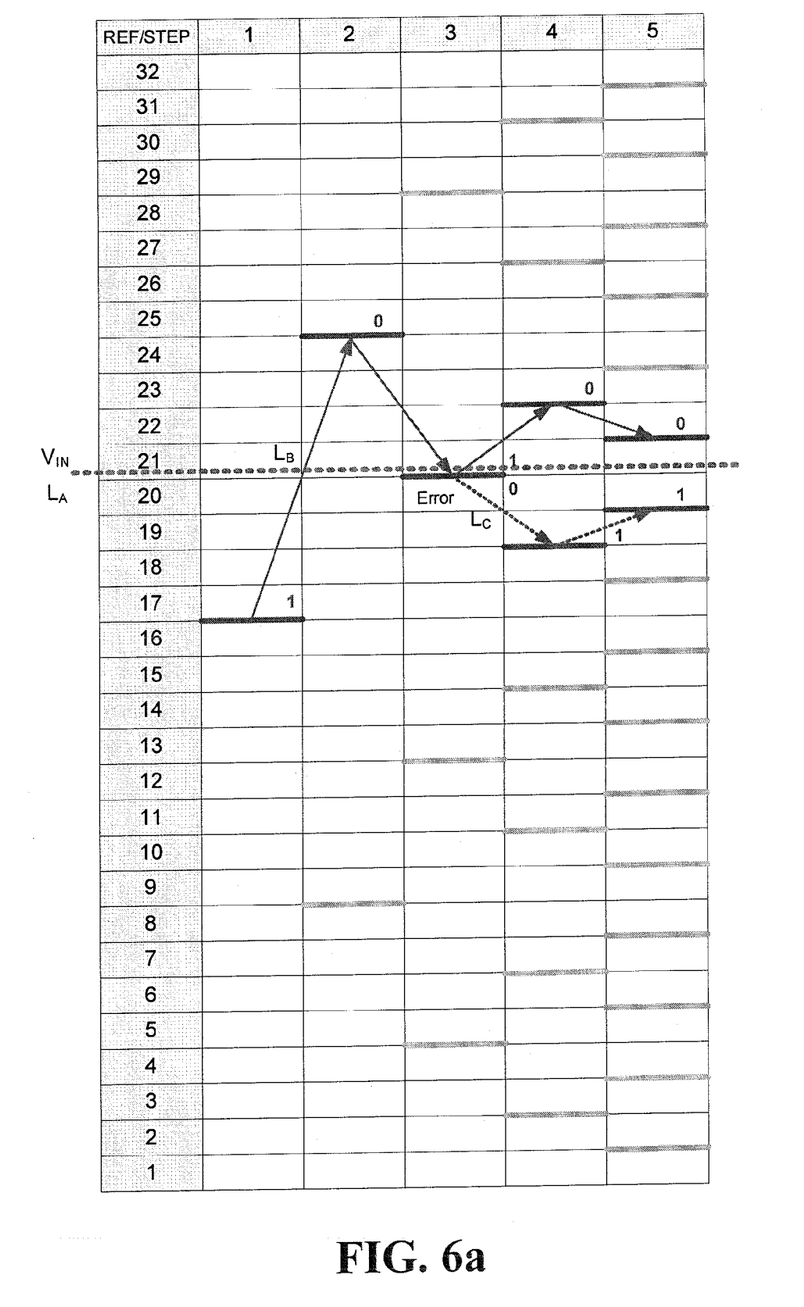
Figure 6B:
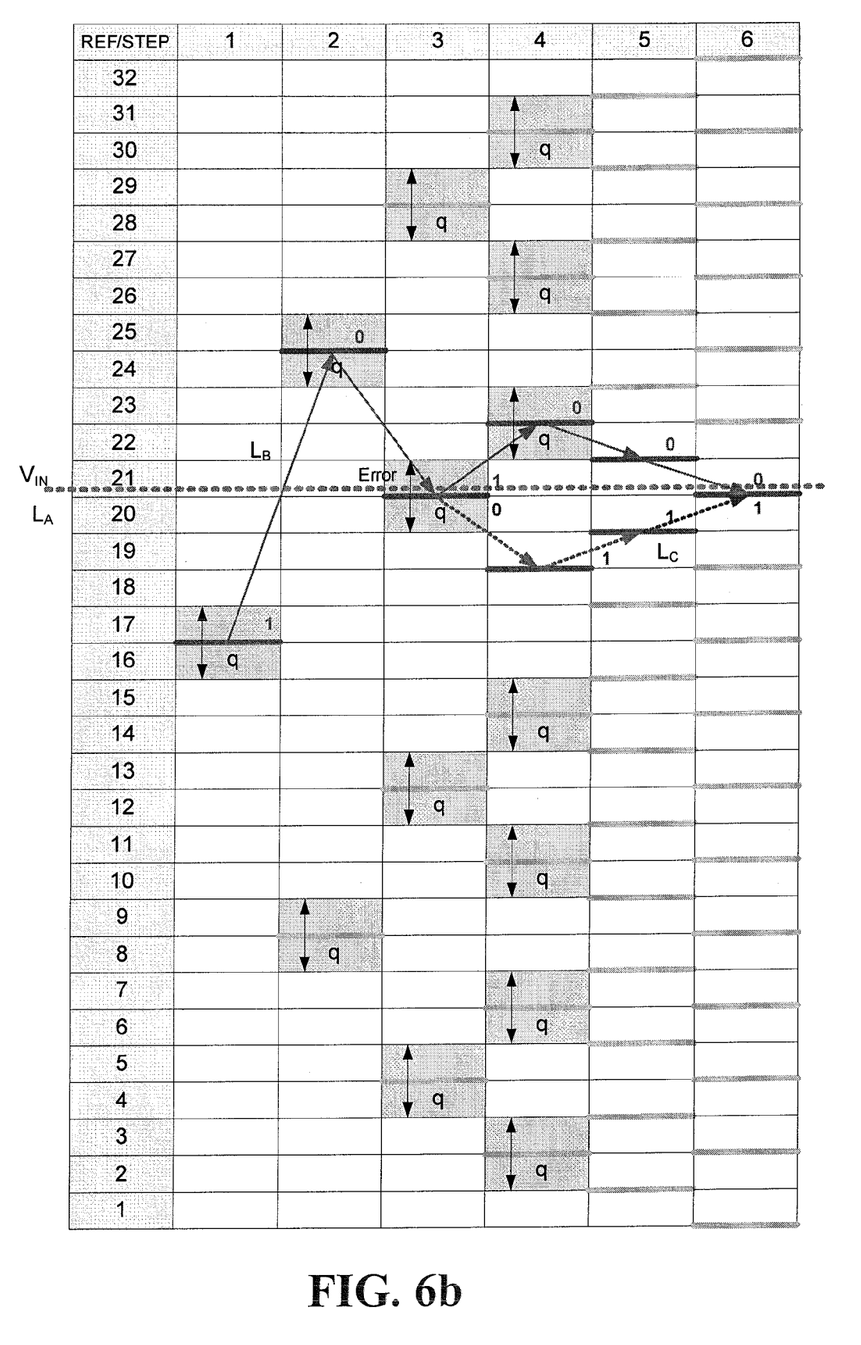

FIG. 6(a) and FIG. 6(b) illustrate the handling of errors in the binary and non-binary search processes. FIG. 6(a) shows the binary search process for a 5-bit SAR ADC and FIG. 6(b) shows a non-binary search process applied to it. The green dot-line "$L_A$" in FIG. 6(a) and FIG. 6(b) represents the analog input level. It is between the $20^{th}$ reference level and the $21^{th}$ reference level. The blue line "$L_B$" with arrow demonstrates the binary search process without error. The red dot-line "$L_C$" with arrow demonstrates the binary search with error. Both the line "$L_B$" and the line "$L_C$" start from the same point— "level 16". They go through the same path in the first two search steps. Because there is an error at "level 20", in FIG. 6(a), the line "$L_B$" goes to "level 22" in one path and arrives at "level 21" and the line "$L_C$" goes to "level 18" and arrives at level "level 19." Since the two searching paths illustrated by the line "$L_B$" and the line "$L_C$" do not arrive at the same target, the error at the "level 20" in the binary search process cannot be corrected and the final digital output of the SAR ADC is incorrect.

In the non-binary search process illustrated in FIG. 6(b), both the line "$L_B$" and the line "$L_C$" arrive at the same target "level 20" (represented by two digital codes "101000" and "100111"), even though the line "$L_B$" and the line "$L_C$" go to the difference paths in the $3^{rd}$, $4^{th}$ and $5^{th}$ steps. The two digital codes are eventually converted to the same digital output of the SAR ADC. The error due to the comparator meta-stability, reference settling error, or some instant disturbance, such as noise, has been corrected in the last redundant step.

The embodiments are thought to be applicable to a variety of systems for analog-to-digital conversion. Other aspects and embodiments will be apparent to those skilled in the art from consideration of the specification. The various circuits and processes of the embodiments may be implemented as one or more processors configured to execute software, as an application specific integrated circuit (ASIC), or as a logic on a programmable logic device. It is intended that the specification and illustrated embodiments be considered as examples only, with a true scope and spirit of the invention being indicated by the following claims.

What is claimed is:

1. A successive approximation register (SAR) analog-to-digital converter (ADC), comprising:
a comparator having a first input coupled to a first reference voltage;
a multiplexor having an output coupled to a second input of the comparator, a first input coupled to an analog input of the SAR ADC, and a second input coupled to a second reference voltage;
a digital-to-analog conversion (DAC) circuit having a first DAC sub-circuit, a second DAC sub-circuit, and a switch array coupling the first DAC sub-circuit to the second DAC sub-circuit, the DAC circuit being configured and arranged to output the second reference voltage to the second input of the multiplexor; and
a control circuit coupled to the digital-to-analog circuit and configured and arranged to control the comparator, multiplexor, and DAC circuit to perform successive approximation on the analog input over a number of cycles by performing a first non-binary reference search using the first DAC sub-circuit and performing a second non-binary reference search using the second DAC sub-circuit.

2. The SAR ADC circuit of claim 1, wherein the first input of the comparator is coupled to the first reference voltage by way of a first capacitor.

3. The SAR ADC circuit of claim 1, wherein the output of the multiplexor is coupled to the second input of the comparator by way of a second capacitor.

4. The SAR ADC circuit of claim 3, wherein a bottom plate of the second capacitor is coupled to the output of the multiplexor and a top plate of the second capacitor is coupled to the second input of the comparator.

5. The SAR ADC circuit of claim 1, wherein:
the first DAC sub-circuit includes a first reference network, the second DAC sub-circuit includes a second reference network: the second reference network is separated from the first one by a switch matrix; and
the control circuit is configured and arranged to cause the switch matrix to connect first and second reference nodes of the first reference network determined in the first non-binary reference search respectively to a positive terminal of the second reference network and a negative terminal of the second reference network.

6. The SAR ADC circuit of claim 1, wherein the control circuit is configured and arranged to:
determine a search step size in each cycle of the successive approximation; and
in response to an output voltage of the comparator, add the determined search step size to respective values stored in the first or second DAC sub-circuits; or
in response to an output voltage of the comparator, subtract the determined search step size from the respective values stored in the first or second DAC sub-circuits.

7. The SAR ADC circuit of claim 1, wherein the control circuit is configured and arranged to correct error occurring in the first and second non-binary reference searches due to a reference settling error, a comparator meta-stability effect, and noise from the references of the DAC sub-circuits.

8. The SAR ADC circuit of claim 1, wherein
the first DAC sub-circuit is configured and arranged to perform coarse digital-to-analog conversion; and
the second DAC sub-circuit is configured and arranged to perform fine digital-to-analog conversion.

9. The SAR ADC circuit of claim 1, wherein the first DAC sub-circuit includes a plurality of $2^K-1$ unit resistors and a decoder circuit configured to convert binary symbols to one-hot code, each terminal of the plurality of $2^K-1$ unit resistors connected to a first node via a respective switch;
the second DAC sub-circuit includes a plurality of $2^L-1$ unit resistors and a decoder circuit configured to convert binary symbols to one-hot code, each terminal of the plurality of $2^L-1$ unit resistors connected to a second node via a respective switch; and
a second multiplexor having a first input connected to the first node and a second input connected to the second node and an output connected to an output of the DAC circuit.

10. A method for digital-to-analog conversion (DAC), comprising:
in a first DAC circuit, performing a first reference search process on a first set of bits of an input value by executing a first non-binary search that introduces redundancy to reference levels in the first DAC circuit; and
after performing DAC on the first set of bits, using a second DAC circuit, performing a second reference search process on a second set of bits of the input value, the second set of bits being less significant than the first set of bits.

11. The method of claim 10, wherein:
the second reference search process includes executing a second non-binary search that introduces redundancy to reference levels in the second DAC circuit, the second non-binary search being localized in the second DAC circuit;
during the first reference search process, reference levels of the second DAC circuit are not reached; and
during the second reference search process, the reference levels in the first DAC circuit are not reached.

12. The method of claim 11, wherein:
the first non-binary search includes $K_S$ search steps, where K steps perform conventional binary search and $K_S-K$ steps repeating one or more of the K steps;
the second non-binary search includes $L_s$ search steps ($L_S > L$); and
the search steps of the second non-binary search having step sizes such that the sum of the step sizes is equal to the number of internal reference levels of the second DAC circuit, and such that a first reference level provided by the first search step is a middle point of a reference ladder in the second DAC.

13. The method of claim 12, wherein a reference level used in each step of the second non-binary search has a redundancy that is determined by the next search step size and the sum of the following step sizes except the next step size.

* * * * *